United States Patent [19]
Groom

[11] Patent Number: 4,780,688
[45] Date of Patent: Oct. 25, 1988

[54] LARGE SIGNAL OUTPUT CURRENT ENHANCEMENT FOR A DIFFERENTIAL PAIR

[75] Inventor: Terry J. Groom, Arlington, Tex.

[73] Assignee: Harris Corporation, Melbourne, Fla.

[21] Appl. No.: 46,691

[22] Filed: May 7, 1987

[51] Int. Cl.⁴ .............................................. H03F 3/45
[52] U.S. Cl. ..................................... 330/261; 330/255
[58] Field of Search ............... 330/252, 255, 257, 261, 330/296

[56] References Cited
U.S. PATENT DOCUMENTS

| | | | |
|---|---|---|---|
| 4,240,040 | 12/1980 | Saari | 330/261 |
| 4,636,743 | 1/1987 | Cotreau | 330/295 |

Primary Examiner—Gene Wan
Attorney, Agent, or Firm—Barnes & Thornburg

[57] ABSTRACT

A differential pair having a current source for providing amplification and slewing currents and a large signal circuit responsive to the differential pair input signals for shunting slewing current from the current source away from the differential pair for low input differential and linearly varying the amount of slewing current to be provided from the current source to the differential pair for higher input differentials.

12 Claims, 3 Drawing Sheets

LARGE SIGNAL OUTPUT CURRENT ENHANCEMENT FOR A DIFFERENTIAL PAIR

BACKGROUND AND SUMMARY OF THE INVENTION

The present invention relates generally to amplifiers and more specifically to an amplifier having improved slewing characteristics.

A two-stage amplifier, as illustrated in FIG. 1, includes an input stage A1 and an output stage A2. Connected across the output stage is a compensation capacitor $C_C$. The input stage includes two differential input transistors Q1 and Q2 and a current mirror having output transistors Q3 and Q4. The collectors of the transistors Q1 and Q2 are connected to a current source CS1. The collector currents IC of transistors Q1 and Q2, for small differential voltages less than 50 millivolts, determines the AC, noise and DC performance 15 parameters. In a typical amplifier the current available to slew the compensating capacitor $C_C$ is equal to two times the normal collector current expressed as $$\text{Slew Rate} = \frac{2I_C}{C_C}$$

To obtain higher slew rates, designers have two options, namely, to decrease the size of the compensation capacitor $C_C$, or increase the current available to charge the capacitor $C_C$. Decreasing the size of the compensation capacitor $C_C$ is undesirable because this directly affects the small signal parameters. A more desirable alternative is generally to design for small signal parameters and then add a circuit which delivers additional current to slew the compensation capacitor under large signal conditions.

One method to provide the additional current, as described in U.S. Pat. No. 4,240,040 is to provide a range extender stage in parallel with a balanced common base stage between the input and output stages each having its own current source. Another method is to provide a large signal stage in parallel with the small signal stage at the front end or input stage. The large and small signal stage each has their own current source. This method is described in co-pending U.S. Ser. No. 782,690 filed Oct, 1, 1985 to Gerald M. Cotreau.

The use of separate current sources for the small signal stage and large signal stage adversely affects the settling time. Most amplifiers use the current enhancement to increase the slew rate. The settling time specification includes the large signal slewing, and the time required for the output to settle to a specified error band around the final value. Separate stages have an AC stage in parallel with a stage which supplies large amounts of current. A problem exists with the current enhancement stage switching off and thus effecting settling time. Another problem exists with nonlinearity. When a large signal is applied, the output is expected to slew to its final value. However this may not be the case. These slew enhancers schemes will display three regions of operation when a small signal pulse is applied. First will be the small signal rise time, second is the dead band where the amplifier slews without the assistance of the current enhancement, and third is the slewing response, as illustrated in FIG. 2.

Thus, it is an object of the present invention to offer a circuit which increases the output current for large signal conditions with an insignificant degradation of AC, noise and DC performance parameters of the differential pair.

Another object is to provide a linear enhancement without the adverse affects of switching.

Still another object is to provide a slew rate enhancement with minimum settling time and output response dead band.

These and other objects of the invention are attained by providing a current source capable of providing amplification and slewing currents and a large signal circuit connected to the current source for shunting varying amounts of slewing current from the amplifier inversely proportional to differential input voltage. The large signal circuit includes a current sink capable of sinking the slewing current and a linear controller connecting the current sink to the current source. The large signal circuit is responsive to the differential input voltage to turn up the linear controller and cause the current sink to draw more current from the current source for small differential inputs and to turn down the linear controller and to cause the sink to draw less current from the current source to allow the current source to provide amplification and slewing current to the amplifier for large differential inputs. The amplifier includes a differential pair of transistors and the large signal circuit also includes a pair of differential transistors connect parallel to the amplifier differential transistors to control the linear controller connecting the current source and the current sink. In this instance the linear controller is similar in operation to a biased output stage rather than being a switch-type differential voltage amplifier.

Other objects, advantages and novel features of the present invention will become apparent from the following detailed description of the invention when considered in conjunction with the accompanying drawings.

DETAILED DESCRIPTION OF THE DRAWINGS

Figure 1:
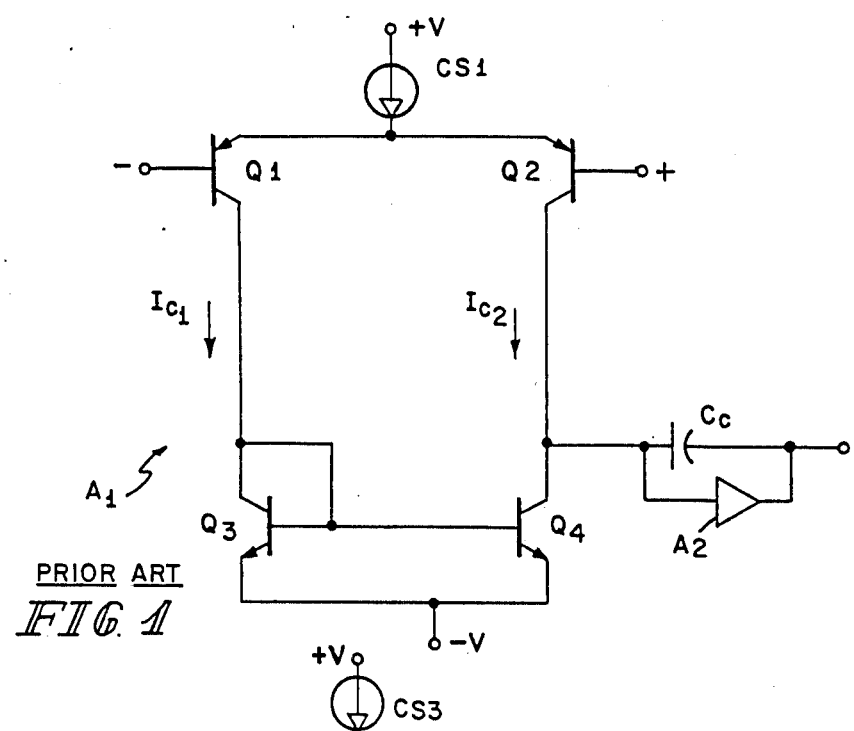
FIG. 1 is a schematic of a two-stage amplifier of the prior art.
Figure 3:
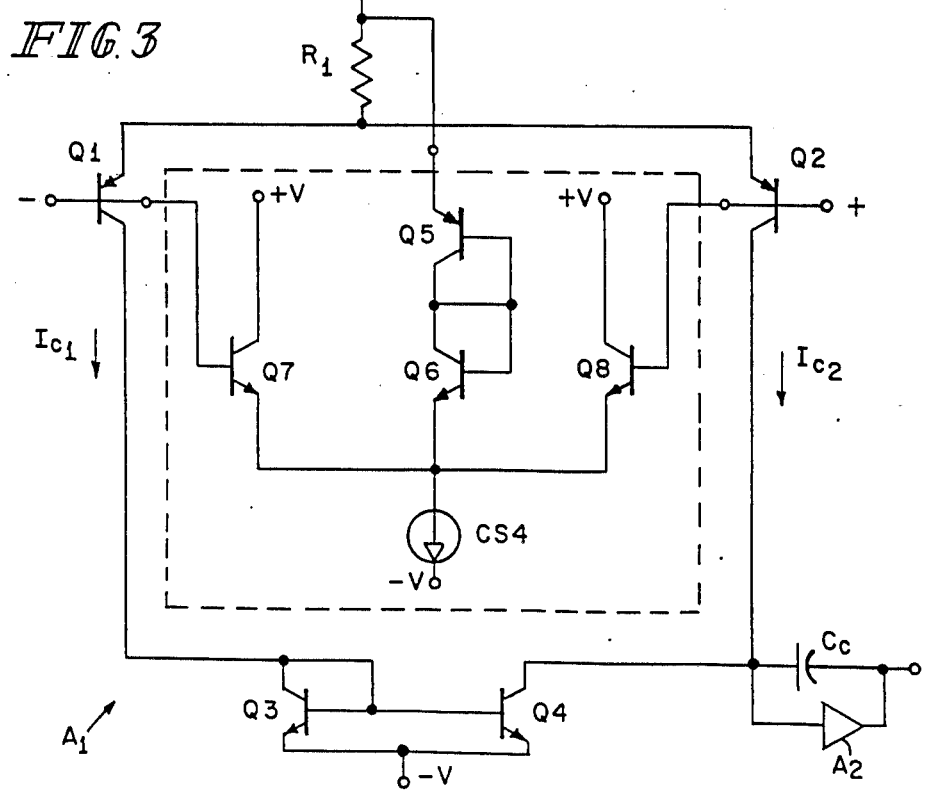
FIG. 3 is a schematic of an amplifier incorporating the principles of the present invention.

The amplifier of FIG. 3 is similar to FIG. 1 and includes a pair of differential input transistors Q1 and Q2 connected with a current mirror having transistors Q3 and Q4. This is the first stage A1 or input stage of a two-stage amplifier. Outpu stage A2 has a compensa capacitor $C_C$ connector in parallel thereto. A current source CS3 is shown connected to the emitters of transistors Q1 and Q2 through a resistor R1. Resistor R1 is the linearizing element and provides the biasing voltage for Q7 and Q8. The value of the current source C3 is designed to provide not only the required collector current levels for Q1 and Q2 for small signal differential voltages, but also to provide the additional slewing current needed for large signal input differentials.

The circuit elements included in the dotted box includes a current sink CS4 and appropriate large signal output current enhancement elements to constitute the large signal circuit. This includes transistors Q5 and Q6 connected between the current source CS3 and the current sink CS4. Transistors Q5 and Q6 have their emitter collector paths connected in series between the current source CS3 and node A and their bases connected together and to the juncture of the collectors of Q5 and Q6. Transistors Q7 and Q8 have their bases connected to the input terminals or the bases of respective transistors Q1 and Q2 and their emitters connected to node A. The collectors of transistors Q7 and Q8 are connected to the voltage source V+.

Transistors Q1 and Q2 form a first linear transconductive amplifier, transistors Q7 and Q8 form a second linear transconductive amplifier and resistor R1 is a linear biasing element.

The design of the circuit is such that the current source CS3 provides the desired current IC1 and IC2 in the collector paths of Q1 and Q2 as a function of the desired small signal value and the slewing current needed for large signal values and also the current of CS4. The large signal circuit including Q5, Q6, Q7 and Q8 monitors the inputs differential voltage and linearly regulates the amount of current from current source CS3 that is sunk by CS4 as a function of the differential input. The amount of current sunk by CS4 varies from sinking substantially all the slew current during small differential signals and to sinking substantially none of the slew current during large input differential signals.

Under normal conditions, the majority of the current sink of CS4 flows through transistors Q5 and Q6. This current is then subtracted from the current of current source CS3 to define the bias current for Q1 and Q2. The base emitter voltage across Q5 and Q6 is less than the voltage across the resistor R1 and the input differential pair Q1 and Q2 define the base emitter voltage and the current levels for Q7 and Q8. For small input signals, transistors Q7 and Q8 are slightly on and Q5 and Q6 are totally on interconnecting the current sink CS4 to the current source CS3 to sink substantially all the additional slewing current. Thus, the nominal differential pair current level is defined as follows:

$$IC1 = IC2 = \frac{(CS3 - CS4)}{2}$$

During the transition from small signal to large signal, less of the slewing current is sunk by current sink CS4 via Q5 and Q6. The large signal appearing across the input terminals will drive one of the monitoring transistors Q7 or Q8 on harder and decrease the on drive of the other transistor. The harder on transistor Q7, Q8 will respond linearly to provide current to current sink CS4 and thereby diminish the amount of current from CS3 being shunted from the Q1 and Q2 by Q5, Q6 and CS4.

Under slewing conditions, a large voltage will appear across the positive and negative input terminals. Under these conditions, one of the monitoring transistors Q7 or Q8 will be driven on hard depending upon which terminal has the highest input signal. This will debias or turn off the other monitoring transistor Q7 or Q8 as well as debiasing or turning off the series transistors Q5 and Q6. The driving on hard of one of the monitoring transistors Q7 or Q8 will clamp node A to one diode drop below the most positive slewing terminal. This debiases Q5 and Q6 and provides a shunt for the current sink CS4 through the hard on transistor Q7 or Q8. Thus, the current sink CS4 is disconnected from the current source CS3. This allows all the available current from the current source CS3 to be available to the collectors of transistors Q1 and Q2 which is provided to the compensation capacitor $C_C$. Thus, the slew rate will be equal to the total current of CS3 divided by the capacitor value $C_C$.

Figure 4:
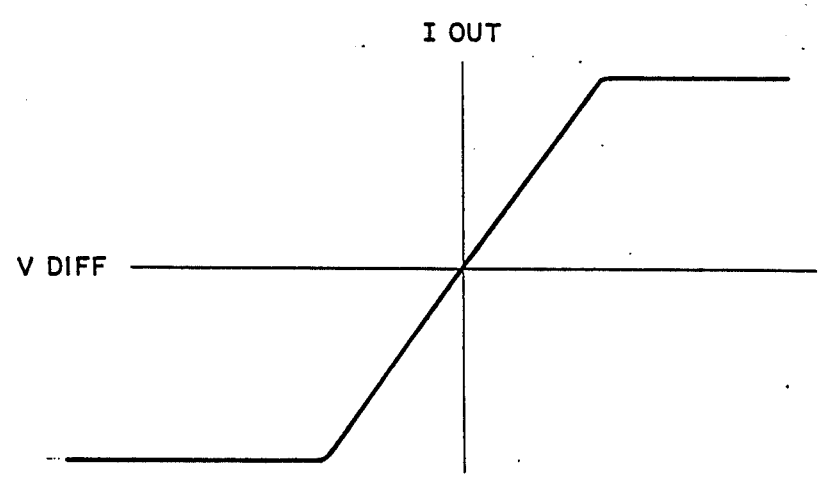
FIG. 4 is a graph of the response of the present invention.

Thus it can be seen that the value for the current sink CS4 is selected such that the value available from the current source CS3 during small signal inputs can be defined for desired small signal responses. This allows control of the AC, noise and DC performance parameters By disconnecting the current sink CS4 from the current source CS3 or providing an alternate source, additional slew current is available without affecting the small signal operational parameters. By using a single current source CS3, the mismatch of components and desired operations at the two levels is assured Also, their response time is increased because the current source CS3 is always operating at its full capacity and linearly varying the amount of current from current source CS3 sunk by current sink CS4 will not delay the providing additional slew current and will linearize the response. Thus it can be seen that the bandwidth of the amplifier is set by the difference between the current sink CS3 and the current source CS4 while the slew rate is set by the value of CS3. As illustrated in FIG. 4, the response of the present invention is lienar compared to the stepped response to the prior art illustrated in FIG. 2.

Figure 2:
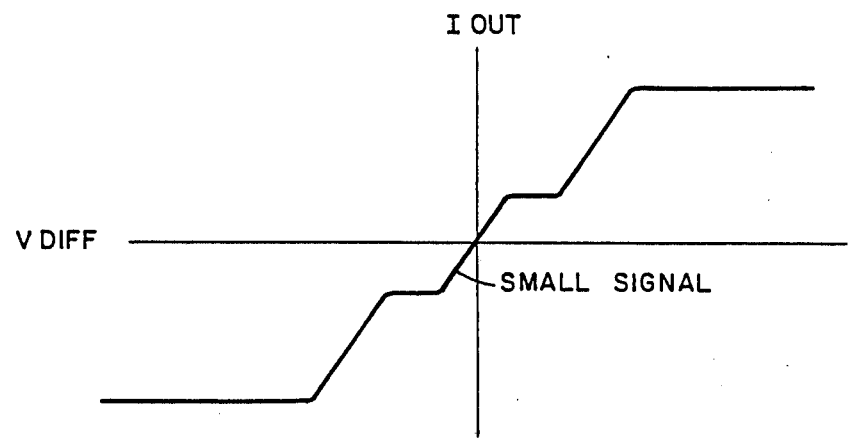
FIG. 2 is a graph of the response of prior art amplifiers.

By way of example, if Q1 and Q2 are one hundred times larger than Q7 and Q8 and CS3=300 micro amps and Cs4=201 micro amps the following currents will result The voltages for the small and large signals are but examples for purposes of illustration since there is no transition as shown in FIG. 4 compared to the prior art shown in FIG. 2.

|  | IC1 | IC2 | IE6 | IE7 | IE8 |
|---|---|---|---|---|---|
| No input signal | 50 | 50 | 200 | 0.5 | 0.5 |
| Small signal (+10 mv) | 76 | 25 | 199 | 0.25 | 1.75 |
| Large signal (+50 mv) | 300 | 0 | 0 | 0 | 201 |

A review of the above table will indicate the relationship between IC1, IC2 and IE6 and between IE6, IE7 and IE8, namely that the sum of the currents IC1+IC2+IE6 always equals 300 or the value of CS3 and the sum of the currents IE6+IE7+IE8 equals 201 or the value of CS4. With no signal input, IC1 equals IC2 and there is little or no current in the paths IE7 and IE8. As a relatively small differential signal appears across the inputs, one of the paths IC1 becomes more conductive than the other path IC2. One of the monitoring transistors Q8 turns slightly on increasing its relatively small current IE8 compared to IE7 and thus diminishing the current in IE6. It should be noted however, that the currents of IE7 and IE8 at this point are substantially negligible. For a very large signal, the current path IC1 receives all the current of CS3 with IC2 being at 0. Similarly, all the current from the current sink CS4 is through IE8 and there is none in IE6 and IE7. The transition from the no input signal to the hard on full large signal stage is a linear transition of one of the monitoring transistors IE7 or IE8 shunting more and more of current sink CS4 current from IE6. With the diminish of the current through IE6, more of the current of the current source CS3 is available for the current paths IC1 or IC2. The transition is linear as illustrated in FIG. 4 which is distinctive from the step wise transition of the prior art of FIG. 2.

Figure 5:
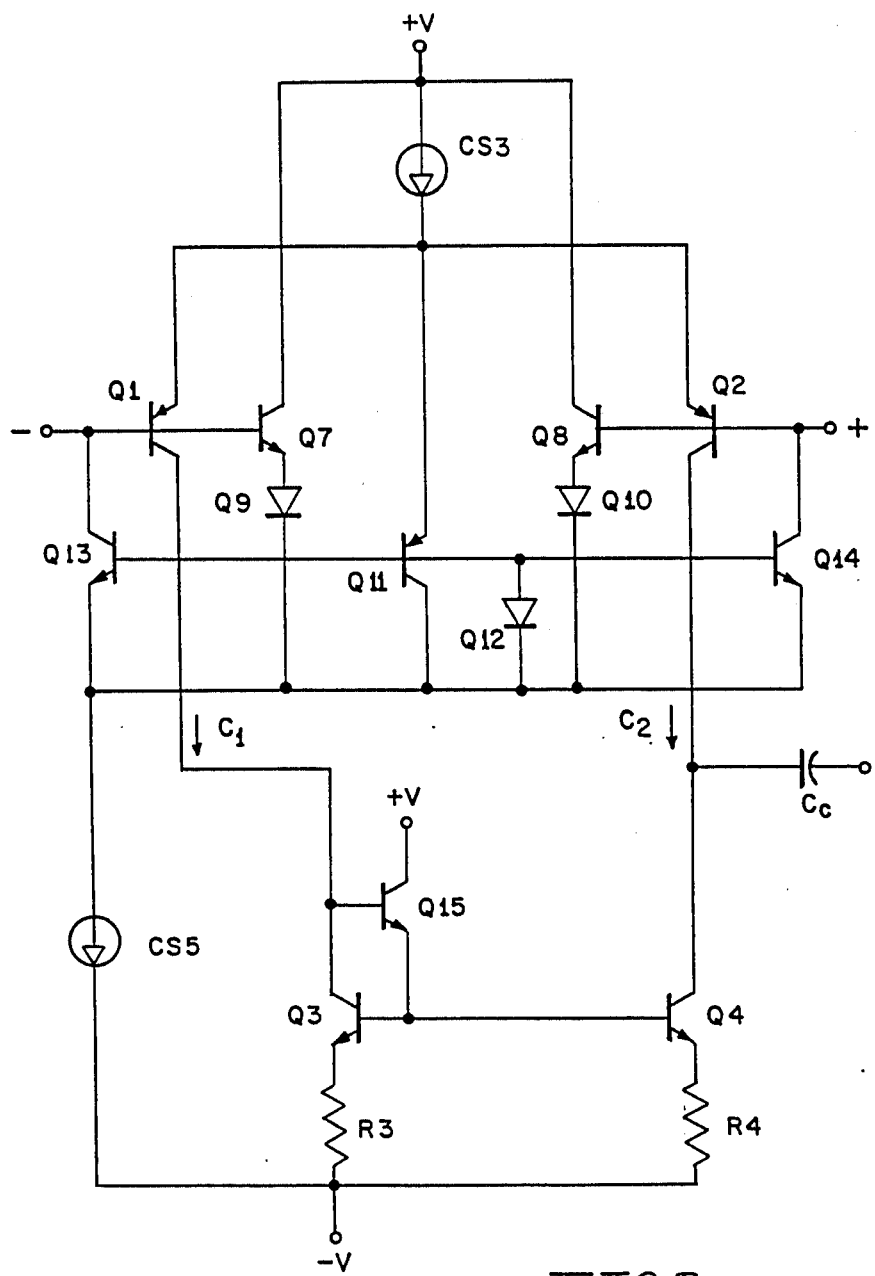
FIG. 5 is a schematic of another operational amplifier also incorporating the principles of the present invention.

Another amplifier incorporating the principles of the present invention is illustrated in FIG. 5. Those elements having the same operational function as in FIG. 3 have the same letters and numbers. The differential pair Q1 and Q2 are connected with current mirrors Q3 and Q4 respectively which includes a transdiode Q15. Resistors R3 and R4 are included in the emitters of transistors Q3 and Q4. Transistor Q11 which is connected between the current source CS3 and node A provides a sample base current which is mirrored by diode Q12 and transistors Q13 and Q14. Transistors Q13 and Q14 are connected to the differential inputs or bases of the differential pair Q1 and Q2 and provide an input bias current cancellation. As in the previous embodiment, large signal monitoring transistors Q7 and Q8 have their bases connected to a respective differential input and their emitters connected to node A through diodes Q9 and Q10. Current sink CS5 is connected between node A and the negative terminal −V.

Under small signal conditions, transistors Q7 and Q8 and diodes Q9 and Q10 are slightly on. Thus, Q11 is on, connecting the current sink CS5 to the current source CS3. Therefore, the current available to the collectors IC1, IC2 of Q1 and Q2 and the current mirror is equal to the difference between CS3 and CS5. This difference determines the small signal bandwidth. The current sink CS5 is used to bias Q11 which generates the input bias current cancellation.

For large signal conditions, when one of the input terminals is one diode drop above the appropriate input terminal, the appropriate pair Q7 and Q9 or Q8 and Q10 begin to turn on harder and, as the input rises, the proper pair will clamp node A to two diode drops below that input terminal. Under these conditions, Q11 becomes completely debiased and turned off, thereby disconnecting the current sink CS5 from the current source CS3. Thus, the full value of the current source CS3 is provided to the compensation capacitor $C_C$ for slewing. Thus, as in FIG. 3, a single current source CS3 is used and a current sink CS5 is linearly phased in and out of the circuit so that the small signal parameters are defined by the difference of the current sink and current source while the slewing rate is determined by the full value of the current source.

Although a diode has been indicated by a legend Q indicating a junction of a transistor, other diodes may also be used. The use of current sink and current source is for the specific embodiments shown and may be interchanged depending upon the conductivity type of the transistors used.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed:

1. An amplifier circuit comprising:
   current source means for providing small signal and slewing currents;
   first amplification means connected to said current source means for providing an output current in response to a differential input voltage; and
   second amplification means for shunting varying amounts of said slewing current from said first amplification means inversely proportional to said differential input voltage.

2. The amplifier circuit of claim 1, wherein said first amplification means includes a differential pair of transistors for providing signal current output from said current source means which corresponds directly with said differential input voltage.

3. The amplifier circuit of claim 2, wherein said second amplification means includes a current sink means for sinking said slew current, a first switch means connecting said current sink means to said current source means, and a differential pair of transistors connected to said first switch means for turning said first switch means off in response to said differential input voltage being above a preselected value.

4. The amplifier circuit of claim 3, wherein said differential pair of transistors of said second amplification means are connected to said current sink means for providing a source of current in response to said differential input voltage.

5. The amplifier circuit of claim 3, wherein input terminals of said differential pair of transistors of said first amplification means and said second amplification means are connected in parallel respectively.

6. The amplifier circuit of claim 3, wherein said first switching means is a diode which is biased off when either of said transistors of said differential pair of said second amplification means is fully on in response to a preselected differential input voltage.

7. The amplifier circuit of claim 1, wherein said second amplification means includes a current sink means for sinking said slew current and a switch means connected between said current source means and said current sink means for interconnecting said current sink means to said current source means in response to said differential input voltage being below a preselected value and for disconnecting said current source means and said current sink means in response to said differential input voltage being above said preselected value.

8. The amplifier circuit of claim 7, wherein said second amplification means further includes control means connected to first switch means and said differential input voltage for switching said first switching means off in response to a differential input voltage above said preselected value.

9. The amplifier circuit according to claim 2, wherein said second amplification means includes a current sink means for sinking said slew current and a differential pair of transistors connected to said current sink means for providing a source of current to said current sink means directly proportional to said differential input voltage.

10. An amplifier circuit having a differential voltage input and a current output comprising:
    first and second linear transconductive amplifier means connected in parallel to said differential voltage input,
    first current source means for providing current to said first linear transconductive amplifier means,
    biasing means for receiving current from said first current source and providing a biasing signal to said second linear transconductive amplifier means, and second current source means for sinking current from said biasing means and said second transconductive amplifier means.

11. An amplifier circuit according to claim 10, wherein said first linear transcondutive amplifier means has a first gain and said second linear transconductive amplifier means has a second gain less than said first gain.

12. An amplifier circuit according to claim 10, wherein said second transconductive amplifier means varies the amount current sunk from said biasing means by said second current source.

* * * * *